(12) United States Patent
Kim

(10) Patent No.: US 12,471,309 B2
(45) Date of Patent: Nov. 11, 2025

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventor: Nam Kyu Kim, Yongin-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 374 days.

(21) Appl. No.: 18/316,273

(22) Filed: May 12, 2023

(65) Prior Publication Data
US 2024/0266436 A1   Aug. 8, 2024

(30) Foreign Application Priority Data

Feb. 7, 2023 (KR) .......................... 10-2023-0015999

(51) Int. Cl.
| | | |
|---|---|---|
| *H10D 30/60* | (2025.01) | |
| *H10D 30/01* | (2025.01) | |
| *H10D 30/67* | (2025.01) | |
| *H10D 62/13* | (2025.01) | |
| *H10D 62/17* | (2025.01) | |
| *H10D 64/00* | (2025.01) | |

(52) U.S. Cl.
CPC ......... *H10D 30/603* (2025.01); *H10D 30/024* (2025.01); *H10D 30/0281* (2025.01); *H10D 30/673* (2025.01); *H10D 62/154* (2025.01); *H10D 62/158* (2025.01); *H10D 62/393* (2025.01); *H10D 64/111* (2025.01)

(58) Field of Classification Search
CPC ...... H10D 30/65; H10D 62/83; H10D 62/127; H10D 64/025; H10D 64/62; H10D 64/112
USPC ........................................................ 257/343
See application file for complete search history.

(56) References Cited

U.S. PATENT DOCUMENTS

| | | | |
|---|---|---|---|
| 8,754,474 B2 | 6/2014 | Ko | |
| 2012/0126322 A1 | 5/2012 | Ko | |
| 2013/0344671 A1* | 12/2013 | Kim | ...................... H10D 62/127 438/286 |
| 2021/0134954 A1* | 5/2021 | Lin | ........................ H10D 30/65 |

FOREIGN PATENT DOCUMENTS

KR   10-2012-0055139 A   5/2012

\* cited by examiner

*Primary Examiner* — Fazli Erdem
(74) *Attorney, Agent, or Firm* — Central California IP Group, P.C.; Andrew D. Fortney

(57) ABSTRACT

Disclosed are a high voltage semiconductor device and a method of manufacturing the same and, more particularly, a high voltage semiconductor device and a method of manufacturing the same seeking to shorten a path of excess carriers to a body contact and improve breakdown voltage (BV) characteristics accordingly, in addition to minimizing a separation distance between adjacent gate electrodes and improving specific on-resistance (Rsp) characteristics accordingly, by including a plurality of spaced apart body contacts in a body region and offset from each other along a horizontal direction in the semiconductor device.

20 Claims, 15 Drawing Sheets

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2023-0015999, filed Feb. 7, 2023, the entire contents of which are incorporated herein for all purposes by this reference.

BACKGROUND OF THE INVENTION

Field of the Invention

The present disclosure relates to a high voltage semiconductor device and a method of manufacturing the same and, more particularly, to a high voltage semiconductor device and a method of manufacturing the same seeking to shorten a path of excess carriers to a body contact and improve breakdown voltage (BV) characteristics of the device accordingly, in addition to minimizing a separation distance between adjacent gate electrodes and improving specific on-resistance (Rsp) characteristics, by having a plurality of body contacts spaced apart in a body region offset from each other along a length direction of a source in the semiconductor device.

Description of the Related Art

A lateral double-diffused metal oxide semiconductor (LDMOS) is a representative power device with a fast switching response and a high input impedance. Hereinafter, the structure and manufacturing process of a typical LDMOS device will be described in detail.

FIG. 1 is a plan view of first a conventional high voltage semiconductor device, and FIG. 2 is a plan view of another conventional high voltage semiconductor device.

Referring to FIG. 1, a first conventional high voltage semiconductor device 3 includes a pair of gate electrodes 370 spaced apart from each other along the horizontal direction on a substrate 310; a source 330 in the substrate 310, on or at the surface thereof; and a body contact 350 that contacts the source 330. A plurality of the body contacts 350 may be in a body region (not shown) spaced apart from each other in an orthogonal direction and spaced apart from the adjacent gate electrodes 370 along the horizontal direction. For example, the body contacts 350 may be an island type and may be substantially at the center of the source 330 or the underlying body region along the horizontal direction. In addition, the source 330 may be on opposite sides of the body contact 350 along the horizontal direction. That is, the semiconductor device 3 may include a first part of the source 330, the body contact 350, and a second part of the source 330 along the horizontal direction.

Thus, a separation distance L1 between the pair of adjacent gate electrodes 370 may correspond to the sum of the lengths 2*L11 of the first and second parts of the source 330 and the length L12 of the body contact 350 along the horizontal direction. This may cause a problem in that specific on-resistance (Rsp) characteristics may deteriorate by increasing the pitch or size of the conventional LDMOS device 3.

In addition, in the conventional semiconductor device 3, a current path distance C1 between the pair of gate electrodes 370 (or between one of the gate electrodes 370 and the source 330) may have a value of 0 since each source 330 surrounds the body contacts 350. In other words, since the source 330 meets or overlaps the adjacent gate electrodes 370 along the horizontal direction, the current path distance C1 between the gate electrodes 370 (or between one of the gate electrodes 370 and the source 330) has a value of 0.

Moreover, since excess carriers escape through the body contact 350, a path distance E1 of the excess carriers between the adjacent pair of gate electrodes 140 (or between one of the gate electrodes 370 and the body contact 350) corresponds to the length L11 of the source 330 in the horizontal direction. That is, the excess carriers escape from a drift region (not shown) through the body contact 350, and since the body region 350 is surrounded by the source 330 in the plan view, the path of the excess carriers is relatively long. As a result, the excess carriers do not escape completely through the body contact 350, which may be a factor in deterioration of the breakdown voltage (BV) characteristics of the device 3.

Referring to FIG. 2, like the above-described conventional semiconductor device 3, another conventional semiconductor device 5 includes gate electrodes 570 spaced apart from each other along the horizontal direction on a substrate 510; a source 530 in the substrate 510, on or at the surface thereof; and a body contact 550 that contacts the source 530. The body contact 550 may have a bar shape that extends without interruption along an orthogonal direction, in or on a body region (not shown, but in the substrate 510). That is, while the body contact 350 in the above-described semiconductor device 3 is an island-type contact, the body contact 550 in the present semiconductor device 5 is a bar-type contact.

In the conventional semiconductor device 5, a separation distance L2 between the pair of adjacent gate electrodes 370 may correspond to the sum of the lengths 2*L11 of the first and second parts of the sources 530 and the length L12 of the body contact 550 along the horizontal direction. Accordingly, as in the above-mentioned semiconductor device 3, this may cause a deterioration in the specific on-resistance (Rsp) characteristics by increasing the pitch or size of the semiconductor device 5. The horizontal length L12 of the body contact 350 in the semiconductor device 3 and the horizontal length L12 of the body contact 550 in the semiconductor device 5 may be different from each other. For example, the latter may be shorter.

In addition, in the conventional semiconductor device 5, a current path distance C2 between the pair of gate electrodes 570 (or between one of the gate electrodes 570 and the source 530) may have a value of 0 since each source 530 surrounds the body contact 550. Moreover, since excess carriers escape through the body contact 350, a path distance E2 of the excess carriers corresponds to the length L11 of the source 530 in the horizontal direction. Thus, all of the problems in the above-described semiconductor device 3 may appear in the semiconductor device 5 as well.

Furthermore, formation of the bar-type body contact 550 uses a mask pattern (not shown) with an opening extending along the orthogonal direction, and problems such as deformation of the pattern profile may occur. In addition, the semiconductor devices 5 in or near a periphery of the wafer may have a body contact 550 biased or shifted in position towards one gate electrode 570, rather than in the center along the horizontal direction between the pair of gate electrodes 570. Accordingly, the area or size of the source 530 on one horizontal side of the body contact 550 is inevitably reduced. As a result, current does not flow smoothly in both directions, which may act as a factor in reducing the on-resistance (Rsp) characteristics.

To solve the above-mentioned problems, the present disclosure concerns a high voltage semiconductor device having a novel structure and a method for manufacturing the same, the details of which will be described later.

Documents of Related Art

Korean Patent Application Publication No. 10-2012-0055139, entitled "LDMOS SEMICONDUCTOR DEVICE."

SUMMARY OF THE INVENTION

The present disclosure has been made to solve the problems of the related art, and an objective of the present disclosure is to provide a high voltage semiconductor device and a method of manufacturing the same that minimize a separation distance between adjacent gate electrodes and improve specific on-resistance (Rsp) characteristics accordingly by including a plurality of island-type body contacts in a body region offset from each other along an orthogonal direction (e.g., orthogonal to a length direction of a source in the semiconductor device).

In addition, an objective of the present disclosure is to provide a high voltage semiconductor device and a method of manufacturing the same that shorten paths of excess carriers to a first body contact and a second body contact and improve breakdown voltage (BV) characteristics accordingly by including the first body contact adjacent to or overlapping a first gate electrode and the second body contact adjacent to or overlapping a second gate electrode.

In addition, an objective of the present disclosure is to provide a high voltage semiconductor device and a method of manufacturing the same that significantly lower the possibility of problems resulting from variations in the mask pattern profile for the body contacts (e.g., by increasing the width or horizontal length of the body contact).

In addition, an objective of the present disclosure is to provide a high voltage semiconductor device and a method of manufacturing the same that maintain the area or size of a source by forming or including body contacts that do not cross the pair of gate electrodes along the horizontal direction and that are spaced apart from each other in the orthogonal direction.

Furthermore, an objective of the present disclosure is to provide a high voltage semiconductor device and a method of manufacturing the same that prevent electric field concentration at the edges or corners of the gate electrodes by forming or including a gate field plate overlapping the gate electrode(s).

According to one or more embodiments of the present disclosure, there is provided a high voltage semiconductor device including a substrate; a first gate electrode and a second gate electrode spaced apart from each other in a horizontal direction on the substrate; a drift region in the substrate; a body region in the substrate between the first gate electrode and the second gate electrode; a drain in the drift region; a source in the body region; and a body contact in the body region, contacting the source, wherein the body contact may include a first island-type body contact and a second island-type body contact spaced apart from each other in an orthogonal direction (e.g., orthogonal to the horizontal direction), wherein center points of the first body contact and the second body contact may be spaced apart or offset from each other in the horizontal direction (e.g., are not colinear in the orthogonal direction).

According to another embodiment of the present disclosure, in the high voltage semiconductor device, the first body contact may be adjacent to the first gate electrode, and the second body contact may be adjacent to the second gate electrode.

According to still another embodiment of the present disclosure, in the high voltage semiconductor device, the first body contact may have an edge overlapping the first gate electrode.

According to still another embodiment of the present disclosure, in the high voltage semiconductor device, the first body contact may have substantially the same width as an adjacent part of the source along the horizontal direction.

According to still another embodiment of the present disclosure, in the high voltage semiconductor device, the first body contact may alternate repeatedly with the second body contact along the orthogonal direction.

According to one or more other embodiments of the present disclosure, a high voltage semiconductor device includes a substrate; a first gate electrode and a second gate electrode spaced apart from each other in a horizontal direction on the substrate; a drift region in the substrate; a body region in the substrate between the first gate electrode and the second gate electrode; a drain in the drift region; a source in the body region; a lower insulating film on the substrate; a drain contact passing through the lower insulating film and contacting the drain; a source contact passing through the lower insulating film and contacting the source; and island-type body contacts in the body region that contact the source and are spaced apart from each other along an orthogonal direction, wherein adjacent ones of the body contacts may have orthogonal central axes (or center points) that do not coincide with each other (or that may be spaced apart from each other in the horizontal direction).

According to still another embodiment of the present disclosure, in the high voltage semiconductor device of the present disclosure, the body contacts may be offset from each other along the orthogonal direction.

According to still another embodiment of the present disclosure, in the high voltage semiconductor device of the present disclosure, a separation distance between the first gate electrode and the second gate electrode may be less than or equal to a sum of horizontal direction widths of a part of the source and the body contact in contact with each other along the horizontal direction.

According to still another embodiment of the present disclosure, the high voltage semiconductor device of the present disclosure may further include a gate field plate between each of the gate electrodes and the drain (e.g., a corresponding drain).

According to still another embodiment of the present disclosure, the high voltage semiconductor device of the present disclosure may further include a silicide film on the source, the body contact, each of the gate electrodes and the drain.

According to one or more other embodiments of the present disclosure, there is provided a method of manufacturing a high voltage semiconductor device. The method includes forming a drift region in a substrate; forming a body region in the substrate; forming a first gate electrode and a second gate electrode on the substrate, the first and second gate electrodes extending along an orthogonal direction and spaced apart from each other along a horizontal direction; forming a drain in the drift region and a source in the body region; and forming a body contact in the body region in contact with the source, wherein the body contact may include a plurality of first body contacts spaced apart from each other along the orthogonal direction, and adjacent to or overlapping the first gate electrode; and a second body contact adjacent to or overlapping the second gate electrode.

According to another embodiment of the present disclosure, in the method of manufacturing a high voltage semiconductor device of the present disclosure, the first body contacts and the second body contact may have substantially the same area or size.

According to another embodiment of the present disclosure, in the method of manufacturing a high voltage semiconductor device of the present disclosure, a separation distance in the horizontal direction between centers of the first body contacts and a center of the second body contact may substantially coincide with a horizontal width of the first body contacts or the second body contact.

According to still another embodiment of the present disclosure, the method of manufacturing a high voltage semiconductor device of the present disclosure may further include forming a plurality of gate field plates before forming the first gate electrode and the second gate electrode, wherein each of the first gate electrode and the second gate electrode overlap a corresponding one of the gate field plates. According to still another embodiment of the present disclosure, the method of manufacturing a high voltage semiconductor device of the present disclosure may further include forming a lower insulating film to cover the first gate electrode, the second gate electrode, and the substrate; forming a source contact, a drain contact, and a gate contact in the lower insulating film; and forming a source metal, a drain metal, and a gate metal on the lower insulating film in contact with the source contact, the drain contact, and the gate contact, respectively.

According to still more embodiments of the present disclosure, a method of manufacturing a high voltage semiconductor device of the present disclosure includes forming a drift region in a substrate; forming a body region in the substrate; forming a first gate electrode and a second gate electrode on the substrate, the first and second gate electrodes extending along an orthogonal direction and spaced apart from each other along a horizontal direction; forming a drain in the drift region and a source in the body region; forming first body contacts in the body region that contact the source are spaced apart from each other along the orthogonal direction, and having central axes in the orthogonal direction that coincide with each other; and forming one or more second body contacts between the first body contacts in the orthogonal direction, spaced apart or offset from the pair of first body contacts along the horizontal direction.

According to still another embodiment of the present disclosure, in the method of manufacturing a high voltage semiconductor device of the present disclosure, the second body contact(s) may alternate with the first body contacts along the orthogonal direction.

According to still another embodiment of the present disclosure, in the method of manufacturing a high voltage semiconductor device of the present disclosure, a separation distance between the first gate electrode and the second gate electrode may be less than twice a horizontal width of the first body contacts or the second body contact(s).

According to still another embodiment of the present disclosure, in the method of manufacturing a high voltage semiconductor device of the present disclosure, the first body contacts may be adjacent to the first gate electrode, and the second body contact(s) may be adjacent to the second gate electrode.

According to still another embodiment of the present disclosure, in the method of manufacturing a high voltage semiconductor device of the present disclosure, the first body contacts may overlap with the first gate electrode, and the second body contact(s) may overlap with the second gate electrode.

The above configurations have the following effects.

According to the present disclosure, by having a plurality of island-type body contacts in a body region offset from each other along the orthogonal direction, it is possible to minimize a separation distance between adjacent gate electrodes and improve specific on-resistance (Rsp) characteristics accordingly.

In addition, according to the present disclosure, by forming or including a first body contact adjacent to or overlapping a first gate electrode and a second body contact adjacent to or overlapping a second gate electrode, it is possible to shorten paths of excess carriers to the first body contact and the second body contact and improve breakdown voltage (BV) characteristics accordingly.

In addition, according to the present disclosure, by increasing the horizontal length of the body contact, it is possible to significantly lower the risks of problems such as variations in body contact mask pattern profiles.

In addition, according to the present disclosure, by forming or including body contacts that do not cross the gate electrodes along the horizontal direction and that are spaced apart from each other in the orthogonal direction, it is possible to maintain the area or size of the source.

Furthermore, according to the present disclosure, by forming or including a gate field plate overlapping the gate electrode, it is possible to prevent electric field concentration at the edges or corners of the gate electrode.

Meanwhile, even if certain effects are not explicitly mentioned herein, the effects described in the following specification and/or expected by the technical features of the present disclosure and their potential effects are treated as if they are described in the present specification.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
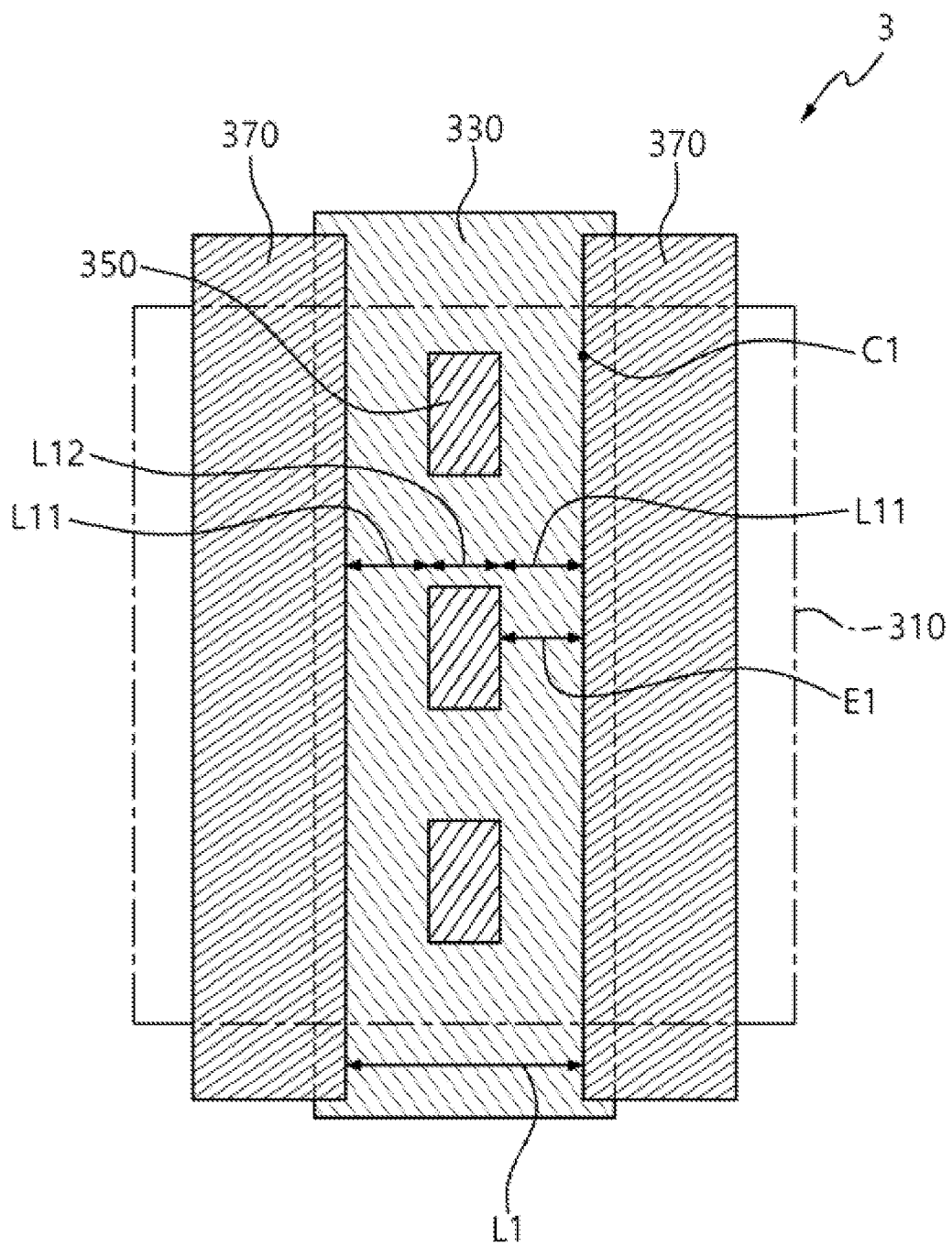
FIG. 1 is a plan view of a first conventional high voltage semiconductor device.

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, the embodiments are provided for reference in order to more completely explain the present disclosure to those of ordinary skill in the art.

Hereinafter, it should be noted that when one component (or layer) is described as being on another component (or layer), the one component may be directly on the other component, or one or more third components or layers may be between the one component and the other component. In addition, when one component is expressed as being directly on or above another component, no other components are between the one component and the other component. Moreover, being located on "top", "upper", "lower", "above", "bottom", or "one (first) side" or "opposite sides" of a component refers to a relative positional relationship.

The terms first, second, third, etc., may be used to describe various items such as various components, regions and/or parts. However, the items are not limited by these terms.

In addition, it should be noted that, where certain embodiments are otherwise feasible, certain process sequences may be performed other than those described below. For example, two processes described in succession may be performed substantially simultaneously or in the reverse order.

The term "metal oxide semiconductor" (MOS) used below is a general term, and "M" is not limited to only metal, but may refer to various types of conductors. Also, "S" may be a substrate or a semiconductor structure, and "O" is not limited to oxide, and may include various types of organic or inorganic dielectric materials.

In addition, the conductivity type of a doped region or component may be "p-type" or "n-type" according to the main carrier characteristics, but this is only for convenience of description, and the technical spirit of the present disclosure is not limited to what is illustrated. For example, hereinafter, "p-type" or "n-type" may be replaced with the more general terms "first conductivity type" or "second conductivity type", and here, the first conductivity type may refer to p-type, and the second conductivity type may refer to n-type.

Furthermore, it should be understood that "high concentration" and "low concentration" referring to the concentration of the dopant in an impurity region refers to the relative doping concentration of one component to another component.

An x-axis direction in the plan views illustrated in the figures may be referred to as a "horizontal direction," and a y-axis direction may be referred to as an "orthogonal direction".

The high voltage semiconductor device described below may comprise, for example, an LDMOS device.

Figure 3:
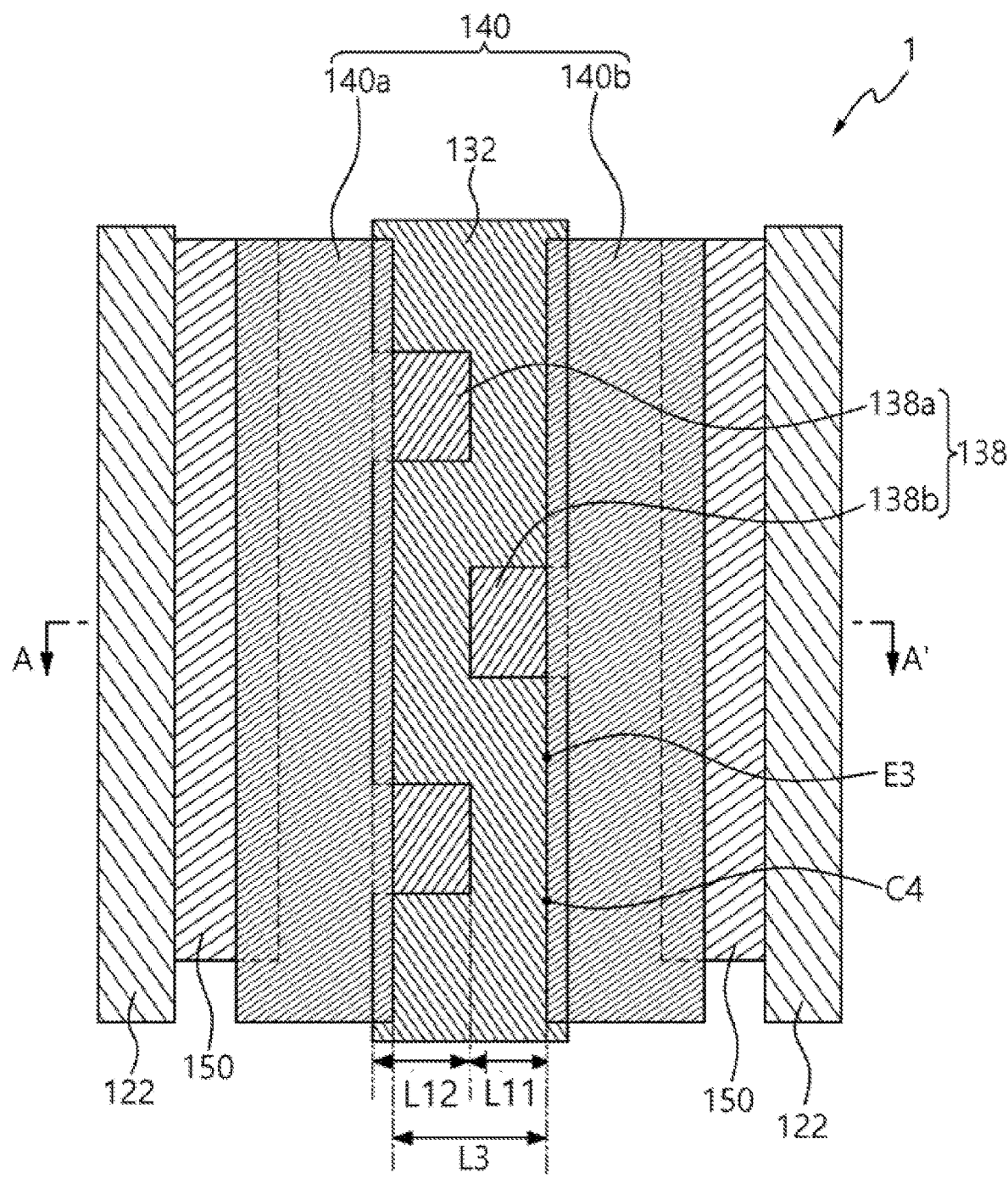
FIG. 3 is a plan view of a high voltage semiconductor device according to one or more embodiments of the present disclosure.
Figure 4:
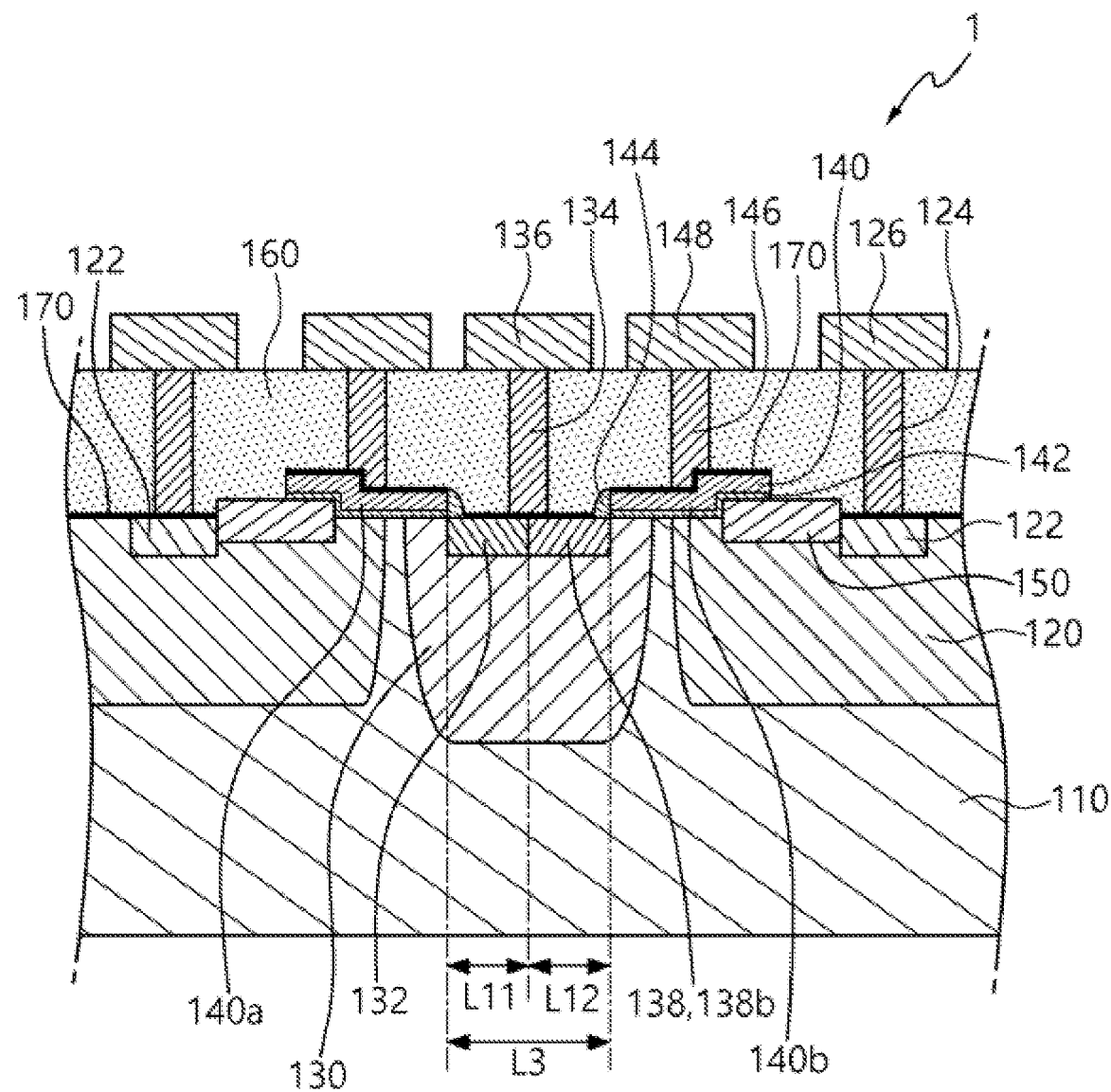
FIG. 4 is a cross-sectional view of the high voltage semiconductor device shown in FIG. 3 along the line A-A'.

FIG. 3 is a plan view of a high voltage semiconductor device according to one or more embodiments of the present disclosure, and FIG. 4 is a cross-sectional view of the high voltage semiconductor device shown in FIG. 3 along the line A-A'.

Hereinafter, a high voltage semiconductor device 1 according to embodiment(s) of the present disclosure will be described in detail with reference to the accompanying drawings.

Referring to FIGS. 3 and 4, the present disclosure relates to a high voltage semiconductor device 1 and a method of manufacturing the same and, more particularly, to a high voltage semiconductor device 1 and a method of manufacturing the same seeking to shorten a path of excess carriers to a body contact 138 and improve breakdown voltage (BV) characteristics (e.g., of the device 1) accordingly, in addition to minimizing a separation distance between adjacent gate electrodes 140 and improving specific on-resistance (Rsp) characteristics (e.g., of the device 1) accordingly, by including a plurality of body contacts 138 spaced apart in a body region 130 and offset from each other along an orthogonal or length direction (e.g., of a source) in the semiconductor device.

The high voltage semiconductor device 1 according to embodiment(s) of the present disclosure includes a substrate 110. A well (not shown) that may define at least in part an active region may be in the substrate 110, and the active region may be (further) defined by a device isolation layer (not shown). The substrate 110 may be doped with a first conductivity type dopant, or may comprise a substrate (e.g., a single-crystal silicon wafer) having a P-type diffusion region therein, or may include a P-type epitaxial layer 101 epitaxially grown thereon a substrate (see FIG. 5). The device isolation layer may be formed by a shallow trench isolation (STI) process, but is not particularly limited thereto.

In addition, in the high voltage semiconductor device 1, it is preferable to prevent electric field concentration at the edge or corner of the gate electrode 140 with a gate field plate 150 between the gate electrode 140 and a drain 122 (to be described later). The gate field plate 150 may comprise a thick oxide (e.g., a shallow trench isolation [STI] structure, a local oxidation of silicon [LOCOS] structure, and/or a tapered oxide), but the scope of the present disclosure is not limited thereto. The gate field plate 150 may at least partially overlap the gate electrode 140 vertically. For example, the gate field plate 150 may overlap an edge of the gate electrode 140 adjacent to the drain 122. Thus, one side or edge of the gate electrode 140 may be on the gate field plate 150.

A drift region 120 may be in the substrate 110 (e.g., at an uppermost surface thereof). The drift region 120 may be spaced apart from a body region 130 to be described later by a predetermined distance, or may be in contact with the body region 130, and may comprise an impurity doped region having a second conductivity type, for example. When the doping concentration in the drift region 120 is below a certain level, the on-resistance characteristics may deteriorate. On the contrary, when the doping concentration is above a second, higher level, the on-resistance characteristics improve, but the breakdown voltage characteristics deteriorate. Thus, it is desirable for the impurity level or doping concentration of the drift region 120 to consider these characteristics. It is preferable that the doping concentration of the drift region 120 is lower than that of the drain region 122, which will be described later.

The drain 122 may be at the surface of the substrate 110 in the drift region 120. The drain 122 may be electrically connected to a drain metal 126 by a drain contact 124. The drain 122 comprises, for example, a high-concentration impurity doped region having the second conductivity type, and may be doped with impurities at a higher concentration than the drift region 120.

The drain contact 124 is electrically connected to the drain 122, and preferably includes a conductive metal or material such as copper, aluminum, or tungsten, but the scope of the present disclosure is not limited by these examples. The drain contact 124 may pass through a lower insulating film 160 on the substrate 110. The lower insulating film 160 may comprise a pre-metal dielectric (PMD)

layer, below and/or formed before a source metal 136, a drain metal 126, and a gate metal 148 (e.g., a first metal or wiring layer).

The drain metal 126 Is electrically connected to the drain contact 124, and preferably includes a conductive metal or material such as copper, aluminum, or tungsten, but the scope of the present disclosure is not limited by these examples. For example, the bottom surface of the drain metal 126 may physically contact the drain contact 124. The drain metal 126 may be on the lower insulating film 160. It should be noted that, for convenience of description, the drain contact 124, the drain metal 126, the lower insulating film 160, as well as a source contact 134, the source metal 136, a gate contact 146, and the gate metal 148, which will be described later, are not shown in the plan view of FIG. 3.

The body region 130 may be in the substrate 110 (e.g., at the surface thereof). The body region 130 may be spaced apart from the drift region 120 by a predetermined distance, or may be in contact with the drift region 120, and may comprise an impurity doped region having a first conductivity type, for example. In addition, the body region 130 is between adjacent gate electrodes 140 along the horizontal direction, and may have a horizontal end that overlaps an individual gate electrode 140.

A source 132 may be at the surface of the substrate 110 in the body region 130. The source 132 comprises, for example, a high-concentration impurity doped region having the second conductivity type, and may be doped at a high impurity concentration compared to the body region 130. In addition, the source 132 is surrounded by the body region 130, has a width or horizontal length of a predetermined distance in the plan view, and may extend in the orthogonal direction between the gate electrodes 140.

The source 132 may be electrically connected to the source metal 136 by the source contact 134. The source contact 134 is electrically connected to the source 132, and preferably includes a conductive metal or material such as copper, aluminum, or tungsten, but the scope of the present disclosure is not limited by these examples. The source contact 134 may pass through the lower insulating film 160 on the substrate 110. In addition, the source metal 136 is electrically connected to the source contact 134, and preferably includes a conductive metal or material such as copper, aluminum, or tungsten, but the scope of the present disclosure is not limited by these examples. The source metal 136 may be on the lower insulating film 160.

A body contact 138 may be in the body region 130 and in contact with the source 132. For example, the body contact 138 and the source 132 may have at least one side or interface in contact with each other. The body contact 138 comprises a high-concentration impurity doped region having the first conductivity type, and may be doped at a high impurity concentration compared to the body region 130.

The gate electrode 140 is on the substrate 110. To be specific, the gate electrode 160 may be between the drain 122 and the source 132 in, on or over the active region. The gate electrode 140 is on or over a channel of the semiconductor device 1, and the channel may be turned on or off by a voltage applied to the gate electrode 140. The gate electrode 140 may include conductive polysilicon, a metal, a conductive metal nitride, or a combination thereof, and may be formed by chemical vapor deposition (CVD), physical vapor deposition (PVD), atomic layer deposition (ALD), metalorganic atomic layer deposition (MOALD), metalorganic chemical vapor deposition (MOCVD), or the like. A gate insulating film 142 is between the gate electrode 140 and the surface of the substrate 110. The gate insulating film 142 may include a silicon oxide (e.g., silicon dioxide), a high dielectric constant material (e.g., hafnium oxide, hafnium silicate, zirconium oxide, zirconium silicate, etc.), or a combination thereof. The gate insulating film 162 may be formed by thermal oxidation, ALD, CVD, or PVD, for example.

Sidewalls of the gate electrode 140 and the gate insulating film 142 may be covered with a gate spacer 144. The gate spacer 144 may comprise an oxide (e.g., silicon dioxide), a nitride (e.g., silicon nitride), or a combination thereof.

The gate contact 146 is electrically connected to the gate electrode 140, and preferably includes a conductive metal or material such as copper, aluminum, or tungsten, but the scope of the present disclosure is not limited by these examples. The gate contact 146 may pass through the lower insulating film 160.

In addition, the gate metal 148 is electrically connected to the gate contact 146, and preferably includes a conductive metal or material such as copper, aluminum, or tungsten, but the scope of the present disclosure is not limited by these examples. The gate metal 148 is on the lower insulating film 160, and the bottom of the gate metal 148 may physically contact the gate contact 146.

Hereinafter, the structures of conventional high voltage semiconductor devices 3 and 5 and the problems resulting therefrom, and the high voltage semiconductor device 1 according to embodiment(s) of the present disclosure to solve those problems will be described in detail.

Referring to FIG. 1, a first conventional high voltage semiconductor device 3 includes gate electrodes 370 spaced apart from each other along the horizontal direction on a substrate 310; a source 330 in the substrate 310 (e.g., at the surface thereof); and a body contact 350 that contacts the source 330. A plurality of the body contacts 350 may be in the body region, spaced apart from each other in an orthogonal direction and spaced apart from the adjacent gate electrodes 370 along the horizontal direction. For example, the body contacts 350 may be an island type and may be substantially at the center of the source 330 or an underlying body region along the horizontal direction. In addition, parts of the source 330 may be on each side of the body contact 350 along the horizontal direction. That is, the semiconductor device 3 may have a first part of the source 330, the body contact 350, and a second part of the source 330 along the horizontal direction.

Thus, a separation distance L1 between the adjacent gate electrodes 370 may correspond to the sum of the horizontal lengths 2*L11 of the parts of the sources 330 and the horizontal length L12 of the body contact 350 along the horizontal direction. This may cause the specific on-resistance (Rsp) characteristics deteriorate by increasing the pitch or size of the conventional LDMOS device 3.

In addition, in the conventional semiconductor device 3, a current path distance C1 between the gate electrodes 370 (or between one of the gate electrodes 370 and the source 330) may have a value of 0 since each source 330 surrounds the body contacts 350. In other words, since the source 330 meets or overlaps the adjacent gate electrodes 370 along the horizontal direction, the current path distance C1 between the pair of gate electrodes 370 (or between one of the gate electrodes 370 and the source 330) has a value of 0.

Moreover, since excess carriers escape through the body contact 350, a path distance E1 of the excess carriers between the adjacent pair of gate electrodes 140 (or between one of the gate electrodes 370 and the body contact 350) corresponds to the length L11 of the source 330 in the horizontal direction. That is, the excess carriers escape from a drift region (not shown) through the body contact 350, and since the body region 350 is surrounded by the source 330 in the plan view, the path of the excess carriers is relatively long. As a result, the excess carriers do not escape completely through the body contact 350, which may be a factor in deterioration of the breakdown voltage (BV) characteristics of the device 3.

Figure 2:
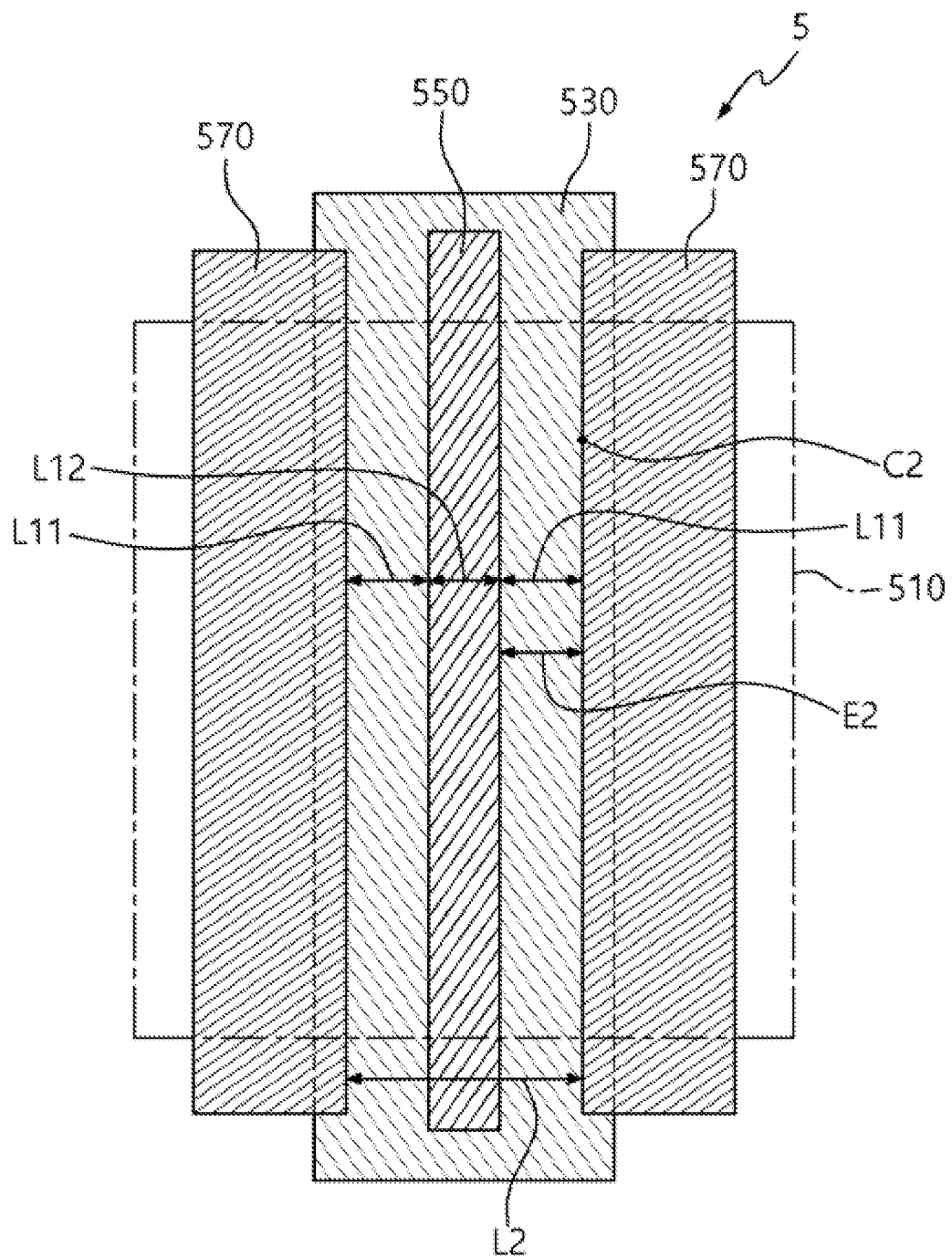
FIG. 2 is a plan view of a second conventional high voltage semiconductor device.

Referring to FIG. 2, like the above-described conventional semiconductor device 3, another conventional semiconductor device 5 includes gate electrodes 570 spaced apart from each other along the horizontal direction on a substrate 510; a source 530 in the substrate 510, on or at the surface thereof; and a body contact 550 that contacts the source 530. The body contact 550 may have a bar shape that extends without interruption along the orthogonal direction in or on a body region (not shown, but in the substrate 510). That is, while the body contact 350 in the above-described semiconductor device 3 is an island-type contact, the body contact 550 in the semiconductor device 5 is a bar-type contact.

In the conventional semiconductor device 5, a separation distance L2 between the pair of adjacent gate electrodes 370 may correspond to the sum of the lengths 2*L11 of the first and second parts of the sources 530 and the length L12 of the body contact 550 along the horizontal direction. Accordingly, as in the above-mentioned semiconductor device 3, this may cause a deterioration in specific on-resistance (Rsp) characteristics by increasing the pitch or size of the semiconductor device 5. The horizontal length L12 of the body contact 350 in the semiconductor device 3 and the horizontal length L12 of the body contact 550 in the semiconductor device 5 may be different from each other. For example, the latter may be shorter.

In addition, in the conventional semiconductor device 5, a current path distance C2 between the pair of gate electrodes 570 (or between one of the gate electrodes 570 and the source 530) may have a value of 0 since each source 530 surrounds the body contact 550. Moreover, since excess carriers escape through the body contact 350, a path distance E2 of the excess carriers corresponds to the length L11 of the source 530 in the horizontal direction. Thus, all of the problems in the above-described semiconductor device 3 may appear in the semiconductor device 5 as well.

Furthermore, formation of the bar-type body contact 550 uses a mask pattern (not shown) with an opening extending along the orthogonal direction, and problems such as deformation of the pattern profile may occur. In addition, the semiconductor devices 5 in or near a periphery of the wafer may have a body contact 550 that is biased or shifted in position towards one gate electrode 570, rather than in the center along the horizontal direction between the pair of gate electrodes 570. Accordingly, the area or size of the source 530 on one horizontal side of the body contact 550 is inevitably reduced. As a result, current does not flow smoothly in both directions, which may act as a factor in reducing the on-resistance (Rsp) characteristics.

To solve the above-mentioned problems, referring to FIGS. 3 and 4, the high voltage semiconductor device 1 according to embodiment(s) of the present disclosure in at least some areas includes island-type body contacts 138 spaced apart from each other along the orthogonal direction and spaced apart along the horizontal direction. For example, in at least some areas, the body contacts 138 may be offset from each other along the horizontal direction.

Hereinafter, for convenience of description, the left gate electrode 140 in the cross-sectional and plan views of FIGS. 3 and 4 is referred to as a "first gate electrode 140a," while the right gate electrode 140 is referred to as a "second gate electrode 140b". In addition, in the plan view, any one body contact 138 may be referred to as a "first body contact 138a," while the body contact adjacent to the first body contact 138a along the orthogonal direction is referred to as a "second body contact 138b".

The first body contact 138a may be in the body region 130, adjacent to the first gate electrode 140a. As an example, the first body contact 138a may have an edge or border that overlaps an edge or sidewall of the first gate electrode 140a in the vertical direction, but is not particularly limited thereto. As another example, the first body contact 138a may partially overlap the first gate electrode 140a in the vertical direction, and due to this, the width or length of the first body contact 138a in the horizontal direction may be relatively large (e.g., in comparison with the devices 3 and 5 in FIGS. 1-2, for otherwise identical devices having the same minimum design rules), to minimize the length of the path for excess carriers. In addition, the first body contact 138a may have approximately the same width in the horizontal direction as the part of the source 132 adjacent to or in contact with the first body contact 138a in the horizontal direction (e.g., within margins or a manufacturing error range), but the scope of the present disclosure is not limited thereto.

The second body contact 138b may be in the body 130, adjacent to the second gate electrode 140b. As an example, the second body contact 138b may have an edge or border that overlaps an edge or sidewall of the second gate electrode 140b in the vertical direction, but is not particularly limited thereto. As another example, the second body contact 138b may partially overlap the second gate electrode 140b in the vertical direction. In addition, the second body contact 138b may have approximately the same width in the horizontal direction as the part of the source 132 adjacent to or in contact with in the horizontal direction (e.g., within margins or a manufacturing error range), but the scope of the present disclosure is not limited thereto.

The first body contact 138a and the second body contact 138b are island type contacts, and are spaced apart from each other in the orthogonal direction, but the center points (e.g., in the plan view) of both body contacts 138a-b may be spaced apart or offset from each other along the horizontal direction. When the body contacts 138a-b have substantially identical dimensions and an outermost border that is substantially coplanar with the outermost border of the source 132, the horizontal separation distance between the center points may be the horizontal extension length between the first body contact area 138a and/or the second body contact area 138b, or alternatively, the width of the source 132 in the horizontal direction minus the width L12 of the body contacts 138a-b in the horizontal direction, but the scope of the present disclosure is not limited thereto.

Thus, the distance L3 between the pair of gate electrodes 140a-b may correspond to the sum of (i) the horizontal length L11 of the part of the source 132 between the body contact 138 and the more distant gate electrode 140 and (ii) the horizontal length L12 of the body contact 138 (L3≈L11+L12). Accordingly, compared to the conventional semiconductor devices 3 and 5, the separation distance between the gate electrodes 530 may be minimized, thereby improving the on-resistance (Rs) characteristics of the semiconductor device 1. In the semiconductor device 1 according to embodiment(s) of the present disclosure, the distance C4 of the current path between the pair of gate electrodes 140a and 140b may be 0 or less than the length L12 of the body contact 138 in the horizontal direction (C4<L12). As such, by spacing the body contacts 138 apart from each other in the orthogonal direction, but not crossing or overlapping the gate electrodes 140*a* and 140*b* along the horizontal direction, it is possible to maintain the area of the source 132.

In addition, since excess carriers escape through the body contact 138, the path distance E3 of the excess carriers between the pair of gate electrodes 140*a* and 140*b* may have a value of 0. In this way, as the path of excess carriers is shortened and the resistance of the body region 130 is reduced, it is possible to prevent the breakdown voltage (BV) characteristics of the semiconductor device 1 from deteriorating.

Moreover, although problems such as deformation of the pattern profile may occur when forming a mask pattern for the bar-shaped body contact 550 as in the conventional semiconductor device 5, in the semiconductor device 1 according to embodiment(s) of the present disclosure, the body contact 138 may be relatively wide along the horizontal direction, facilitating mask pattern formation. It is preferable that the body contact 138 has a horizontal length greater than that of the body contact 350 of the conventional semiconductor device 3 to facilitate the body contact and corresponding mask patterning process.

In FIG. 3 as shown, although the first body contact 138*a* and the second body contact 138*b* are offset and alternate repeatedly along the orthogonal direction, in some cases, the first body contact 138*a* and/or the second body contact 138*b* may be consecutive (but still spaced apart) along the orthogonal direction. For example, the semiconductor device 1 may have consecutive first body contacts 138*a* along the orthogonal direction.

A silicide film 170 comprising a metal silicide may be on the drain 122, the source 132, the gate electrode 140 and the body contact 138. In general, in a MOSFET device, a self-aligned silicide (salicide) film 170 comprising a silicide of a metal such as cobalt (Co), nickel (Ni), or titanium (Ti) improves contact resistance and thermal stability.

FIGS. 5 through 17 are cross-sectional views showing structures formed in a method of manufacturing a high voltage semiconductor device according to one or more embodiments of the present disclosure.

Hereinafter, a method of manufacturing a high voltage semiconductor device according to one or more embodiments of the present disclosure will be described in detail with reference to the accompanying drawings. It should be noted that the formation of each component may be different in time from that described, or one or more components may be formed substantially simultaneously with one or more other components. In addition, the manufacturing method of each component to be described below is only exemplary, and the scope of the present disclosure is not limited thereto.

Figure 5:
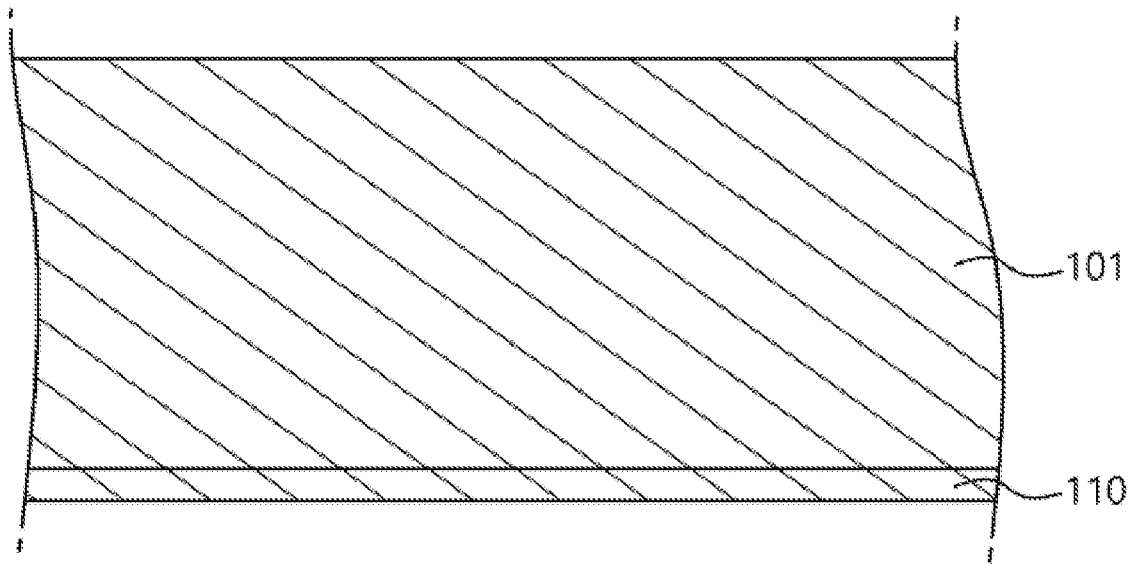
FIGS. 5 through 17 are cross-sectional views showing structures formed in a method of manufacturing a high voltage semiconductor device according to one or more embodiments of the present disclosure.

Referring to FIG. 5, an epitaxial layer 101 having the first conductivity type is grown on the substrate 110 (e.g., by epitaxial growth), and forming the epitaxial layer 101 may comprise sequentially forming a lower epitaxial layer and an upper epitaxial layer. In addition, a buried layer (not shown) having the second conductivity type may be formed in the epitaxial layer 101 by, for example, ion implantation. Hereinafter, the substrate 110 is understood as including the epitaxial layer 101.

Figure 6:
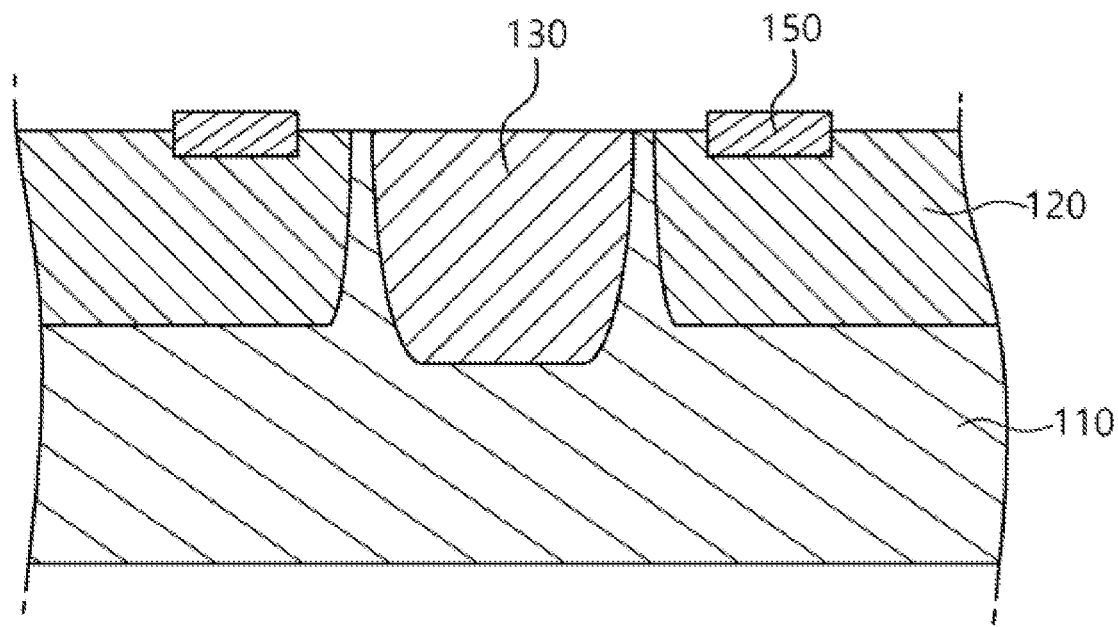

Then, referring to FIG. 6, a body region 130 having the first conductivity type and a drift region 120 having the second conductivity type may be formed in the substrate 110. The body region 130 and the drift region 120 are formed by ion implantation, and the ions may be implanted through corresponding mask patterns (not shown).

Thereafter, an active region may be defined by forming a device isolation layer (not shown). As previously described, the device isolation layer may be formed by shallow trench isolation (STI). In addition, a gate field plate 150 may be formed on the substrate 110 (e.g., on the uppermost surface thereof). The gate field plate 150 may be formed by local oxidation of silicon (LOCOS).

Figure 7:
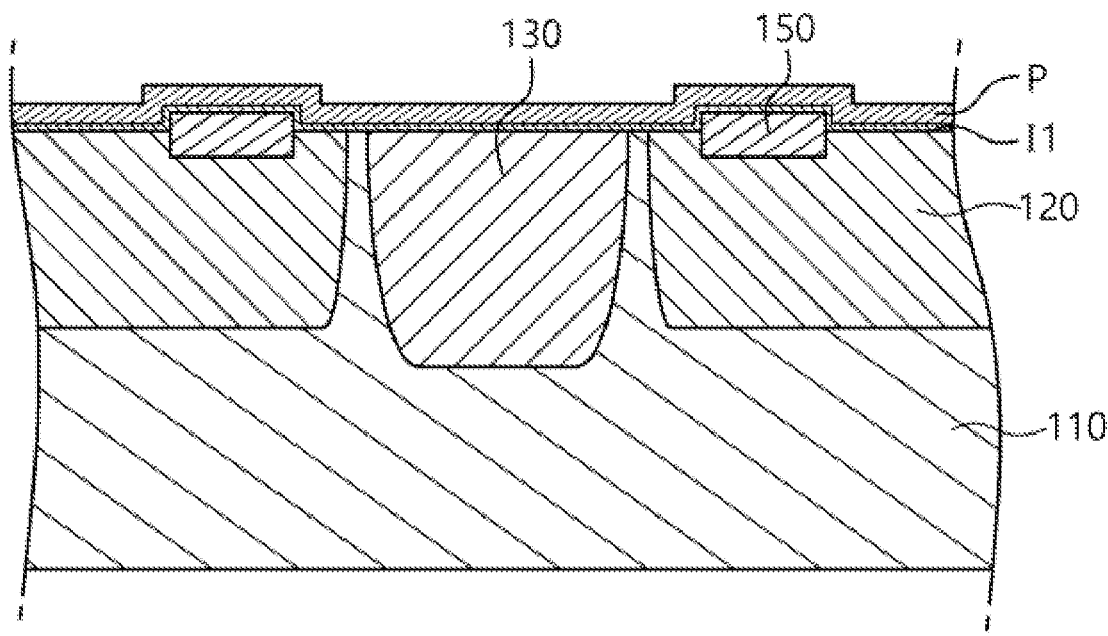
Figure 8:
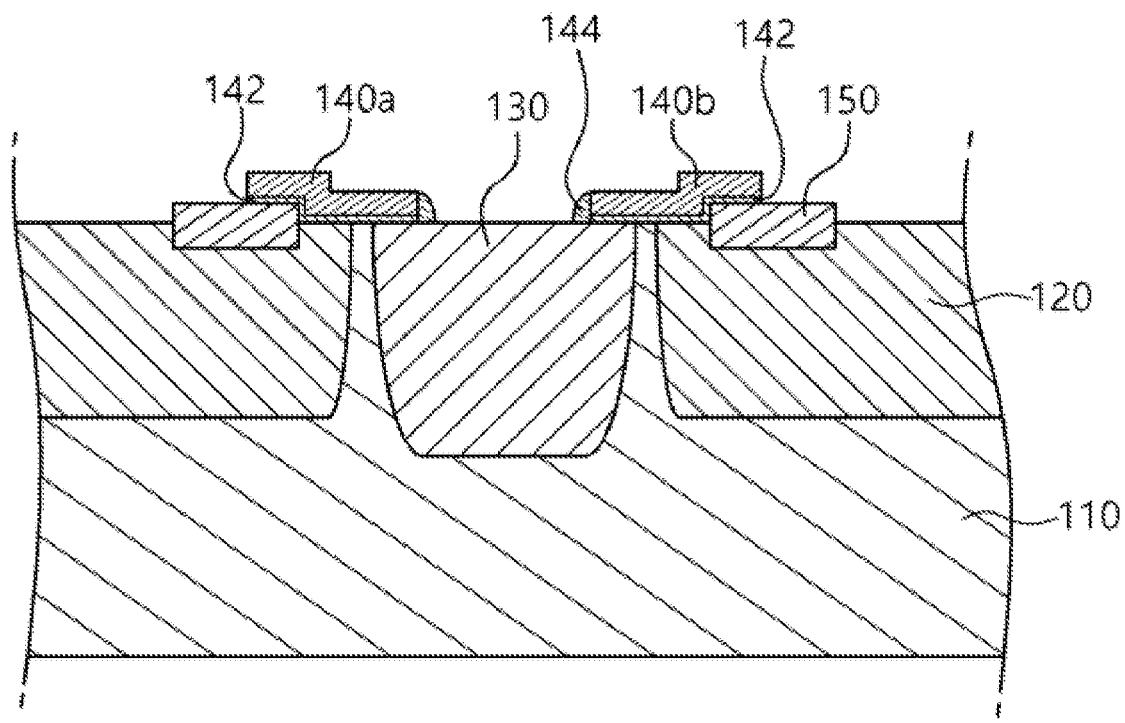

Thereafter, referring to FIG. 7, a first insulating film I1 is formed in the active region on the substrate 110 (e.g., by thermal growth, ALD, CVD or PVD), and a gate film P is deposited on the first insulating film I1 and patterned to form gate electrodes 140*a-b* (FIG. 8). The gate film P may include conductive polysilicon, a metal, a conductive metal nitride, or a combination thereof. The first insulating film I1 may include a silicon dioxide film, a high dielectric constant film, or a combination thereof.

Thereafter, referring to FIG. 8, after forming a mask pattern (not shown) on the gate film P, the gate film P and the first insulating film I1 are sequentially etched. As a result, the gate electrodes 140*a-b* and gate dielectric films 142 are formed.

Then, one or more second insulating films (not shown) is/are deposited on gate electrode 140 and the substrate 110 by, for example, chemical vapor deposition (CVD), then the second insulating film(s) is/are etched by, for example, anisotropic dry etching to form a gate spacer 144 on side surfaces of the gate electrodes 140.

Figure 9:
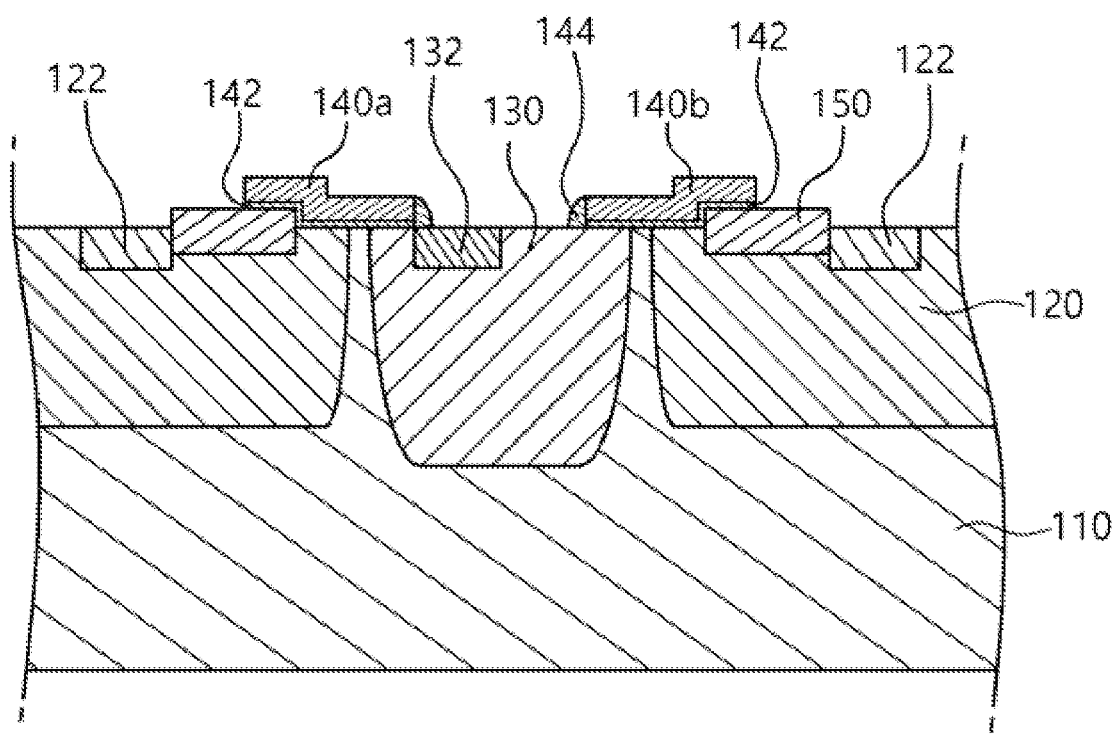

Thereafter, referring to FIG. 9, a drain 122 (e.g., a doped region with high impurity concentration) is formed by ion implantation using the gate field plate 150 as part of a mask.

In addition, a source 132 may be formed in the body region 130 by ion implantation. The source 132 may comprise, for example, a region doped with a high concentration of impurities having the second conductivity type. The source 132 may extend along the extension direction (orthogonal direction) of the gate electrodes 140 in the body region 130. Although, for convenience, FIG. 9 illustrates the source 132 as taking approximately half of the space or distance in the body region 130 between adjacent gate electrodes 140 in the horizontal direction, the source 132 in other places along the orthogonal direction extends the full distance between the adjacent gate electrodes 140. Alternatively, the source 132 may extend the full distance between the adjacent gate electrodes 140 in the horizontal direction along the entire length of the adjacent gate electrodes 140 in the orthogonal direction.

Figure 10:
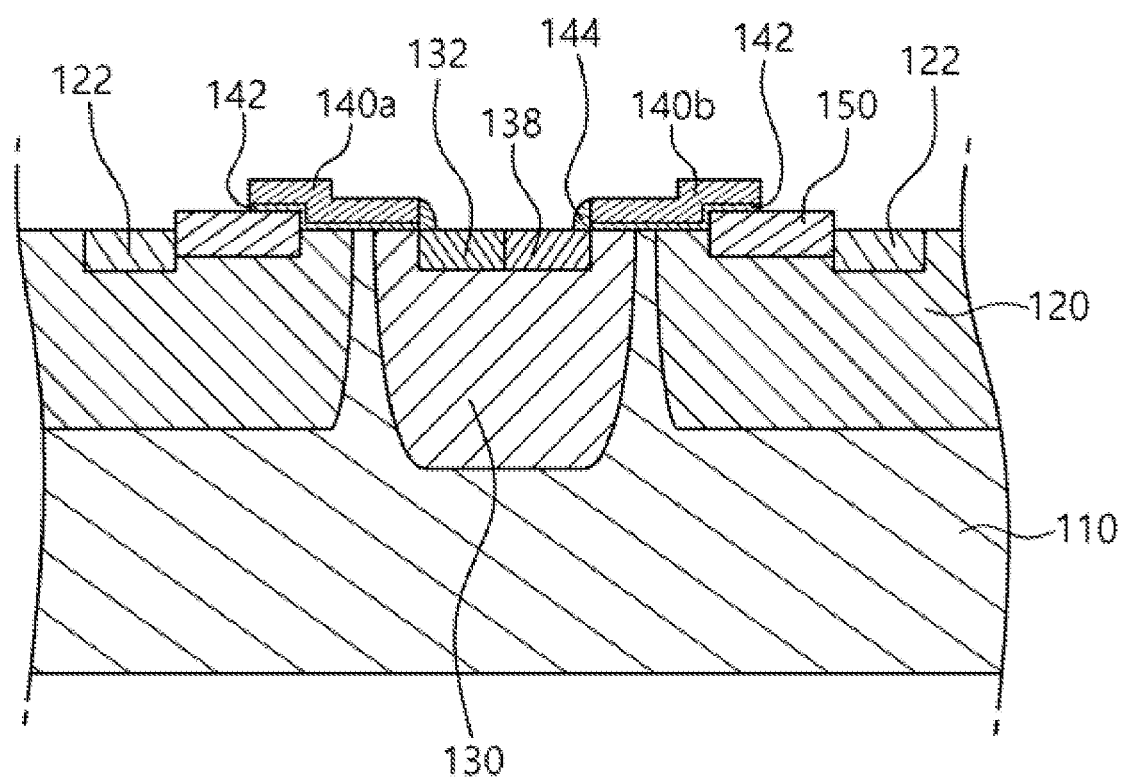

Thereafter, referring to FIG. 10, body contacts 138 may be formed. The body contacts 138 may be formed by ion implantation, and may overlap the source 132 in the body region 130. The body contacts 138 may be spaced apart along the orthogonal direction, for example, and offset from each other along the horizontal direction. A detailed description thereof (e.g., including descriptions of the first body contact 138*a* and the second body contact 138*b*) may be found elsewhere herein.

Figure 11:
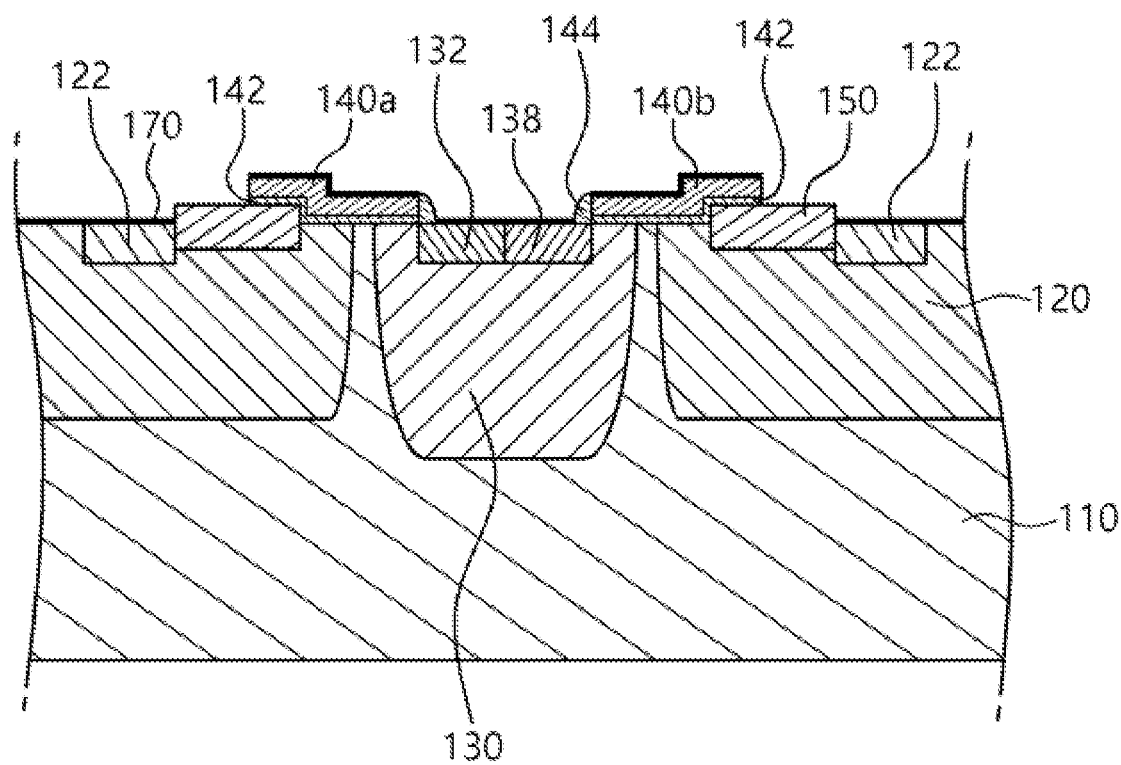

In a subsequent process, referring to FIG. 11, a self-aligned silicide (salicide) film 170 is formed on the drain 122 and/or the source 132 and/or the body contact 138 and/or the substrate 110 using a metal such as cobalt (Co), nickel (Ni), or titanium (Ti) to improve contact resistance and thermal stability. The metal silicide 170 may be formed by blanket-depositing the metal by CVD or PVD, annealing to form the metal silicide, then selective etching to remove the unreacted (unsilicided) metal.

Figure 12:
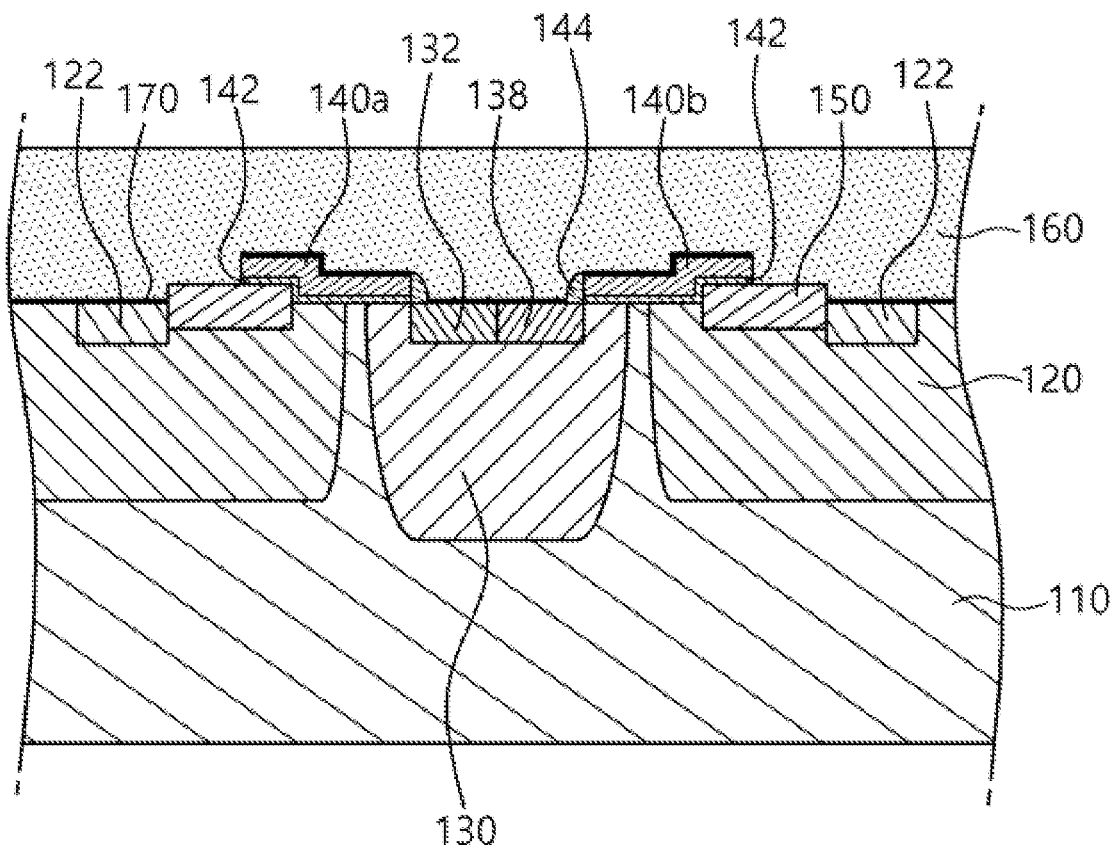

Thereafter, referring to FIG. 12, a lower insulating film 160 may be blanket-deposited to covering the gate electrode 140 and the surface of the substrate 110, then optionally planarized (e.g., by chemical mechanical polishing [CMP]). The lower insulating film 160 may comprise, for example, a silicon dioxide film.

Figure 13:
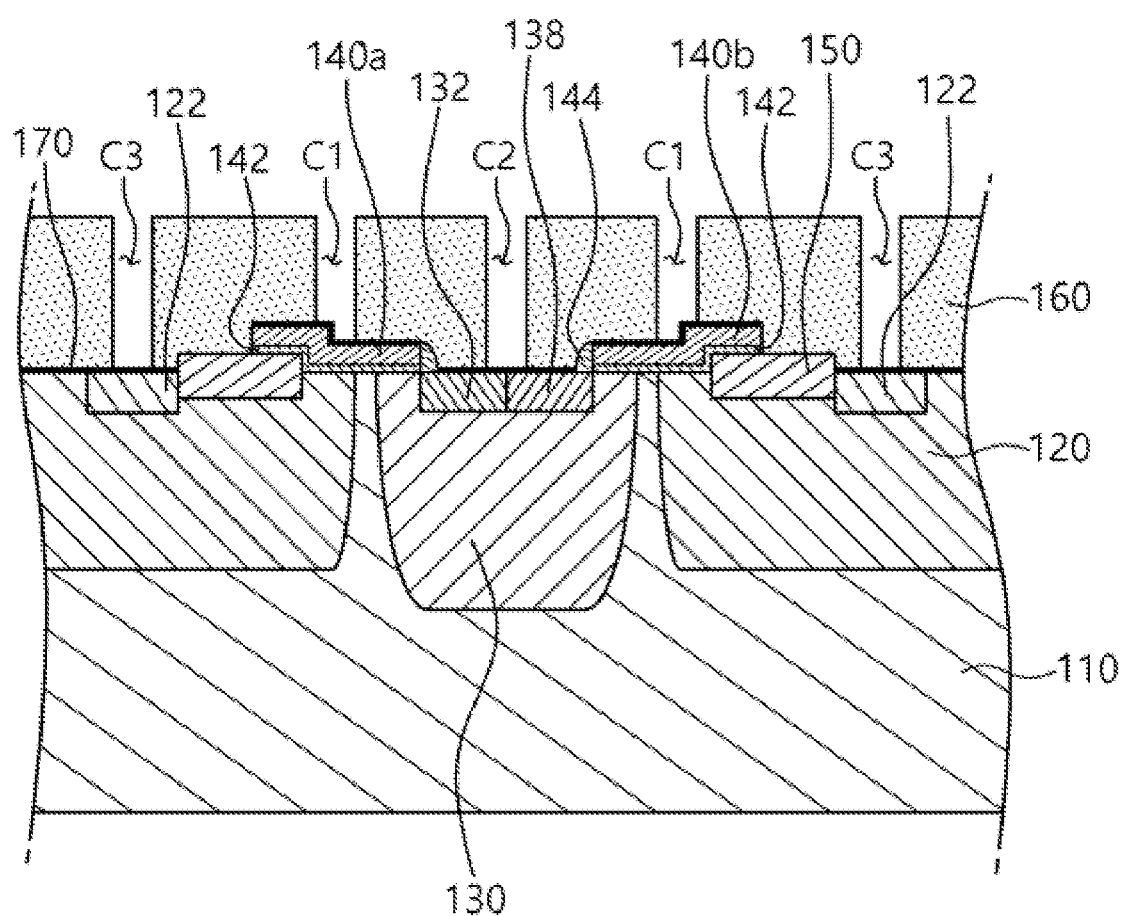

Thereafter, referring to FIG. 13, by etching the lower insulating film 160 using a mask pattern (not shown), contact holes C1, C2, and C3 may be formed in the lower insulating film 160. The contact holes C1, C2, and C3 may expose the drains 122, the source 132, the body contacts 138, and the gate electrode 142.

Figure 14:
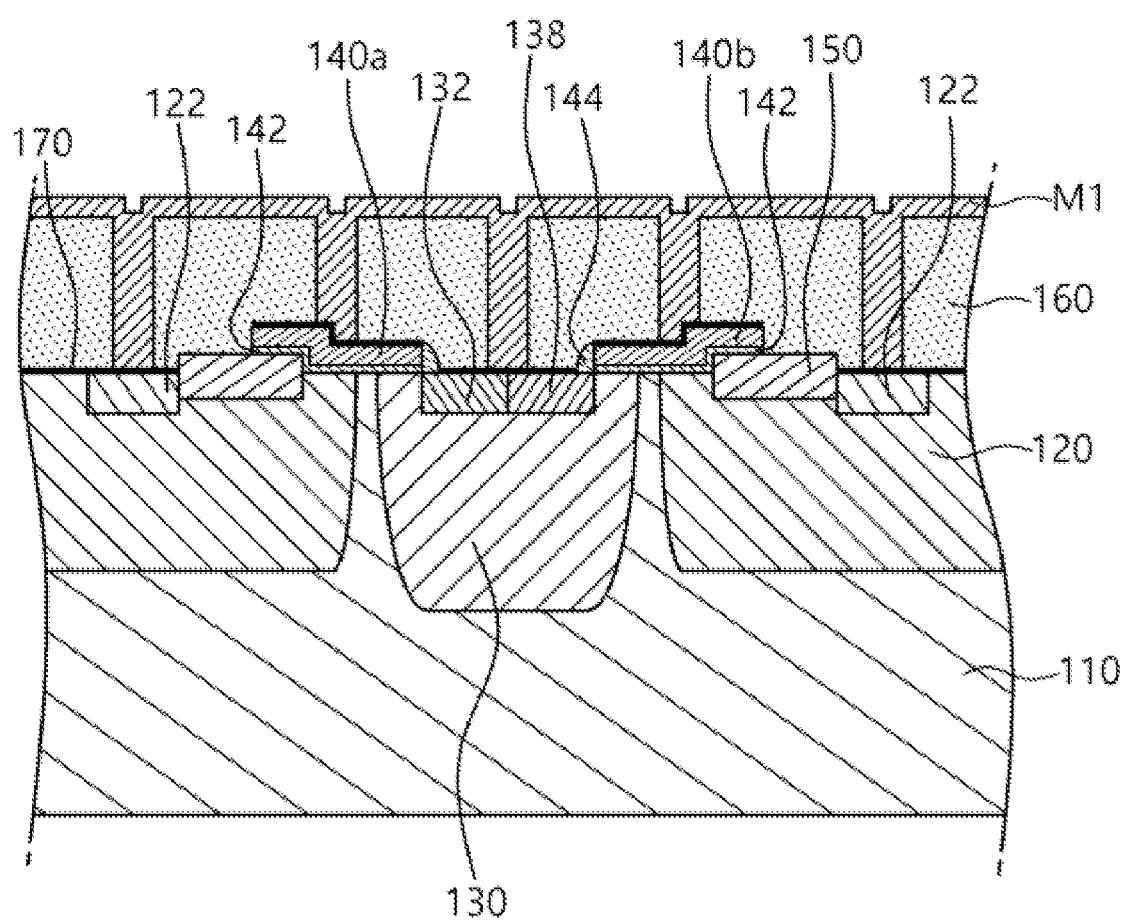

Thereafter, referring to FIG. 14, a first conductive film M1 is formed on the lower insulating film 160 and in the contact holes C1, C2, and C3. The first conductive film M1 preferably includes a conductive metal or material such as copper, aluminum, or tungsten, but the scope of the present disclosure is not limited by these examples.

Figure 15:
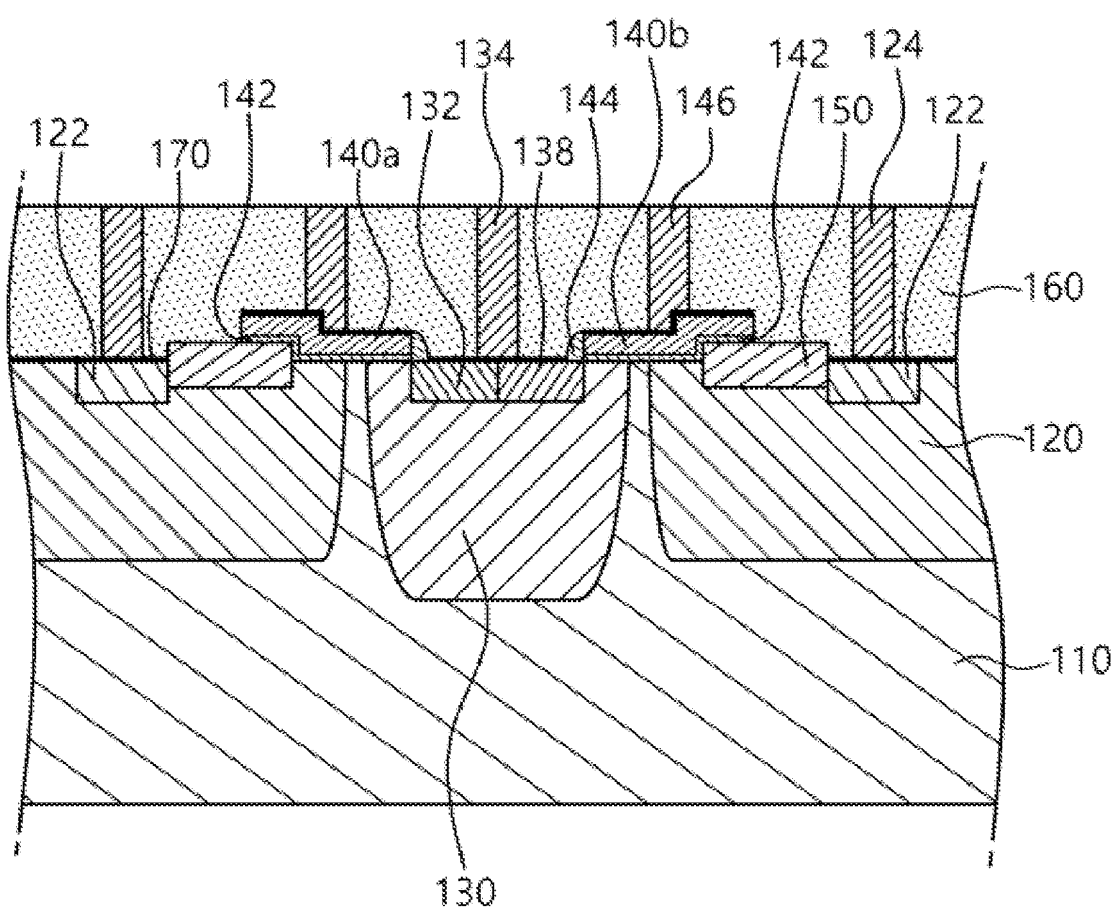

Subsequently, referring to FIG. 15, the drain contact 124, the source contact 134, and the gate contact 146 may be formed by removing the first conductive film M1 outside of the contact holes, typically by CMP. However, the excess first conductive film M1 may also be removed by etchback (e.g., non-selective and/or blanket etching).

Figure 16:
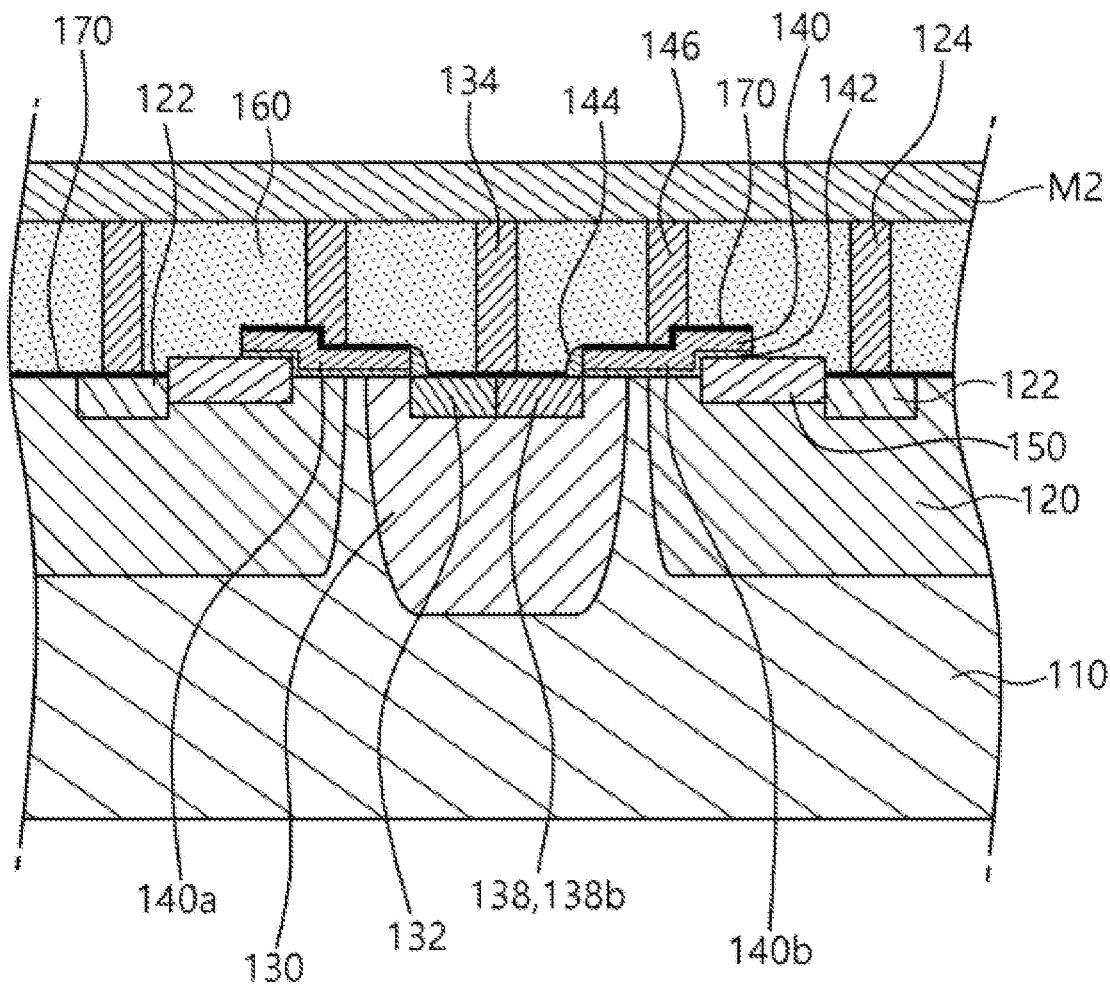
Figure 17:
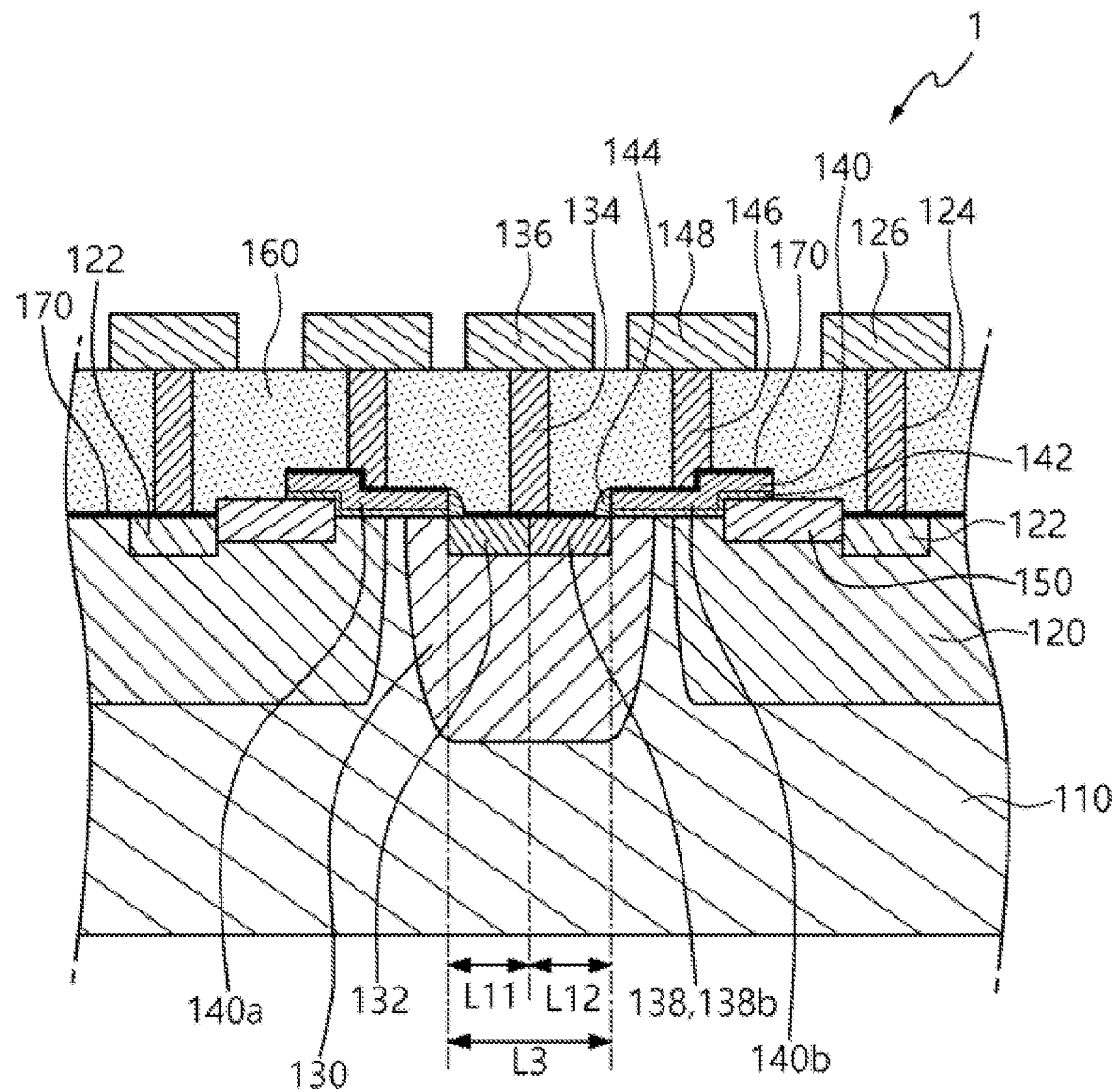

Thereafter, referring to FIG. 16, a second conductive film M2 is formed (e.g., by blanket deposition, and more typically, by CVD and/or sputtering) on the lower insulating film 160. Then, referring to FIG. 17, a drain metal 126, a source metal 136, and a gate metal 148 may be formed by etching the second conductive film M2 using a mask pattern (not shown).

The above detailed description is illustrative of the present disclosure. In addition, the above description shows and describes various embodiments of the present disclosure, and the present disclosure can be used in various other combinations, modifications, and environments. In other words, changes or modifications are possible within the scope of the concept of the disclosure disclosed herein, the scope equivalent to the written disclosure, and/or within the scope of skill or knowledge in the art. The above-described embodiments describe various states for implementing the technical idea of the present disclosure, and various changes for specific applications and/or fields of use of the present disclosure are possible. Accordingly, the detailed description of the present disclosure is not intended to limit the present disclosure to the disclosed embodiments.

What is claimed is:

1. A high voltage semiconductor device, comprising:
   a substrate;
   a first gate electrode and a second gate electrode spaced apart from each other in a first direction on the substrate;
   a drift region in the substrate;
   a body region in the substrate between the first gate electrode and the second gate electrode;
   a drain in the drift region;
   a source in the body region; and
   a body contact in the body region, contacting the source, wherein:
      the body contact comprises a first body contact and a second body contact, each configured as an island type structure and spaced apart from each other along a second direction perpendicular to the first direction, the first and second directions defining a horizontal plane,
      the first body contact is adjacent to the first gate electrode, and the second body contact is adjacent to the second gate electrode,
      each of the first body contact and the second body contact has a width along the first direction smaller than a separation distance between the first gate electrode and the second gate electrode,
      the source extends continuously along the second direction, and
      center points of the first body contact and the second body contact are spaced apart or offset from each other in both the first direction and the second direction.

2. The high voltage semiconductor device of claim 1, wherein the first body contact comprises a plurality of first body contacts, the second body contact a plurality of second body contacts, and one of the plurality of the second body contacts is between an adjacent pair of the first body contacts along the second direction.

3. The high voltage semiconductor device of claim 1, wherein the first body contact has an edge overlapping the first gate electrode.

4. The high voltage semiconductor device of claim 1, wherein the first body contact has substantially a same width as an adjacent part of the source along the horizontal direction.

5. The high voltage semiconductor device of claim 1, wherein the first body contact alternates repeatedly with the second body contact along the orthogonal direction.

6. The high voltage semiconductor device of claim 1, wherein the source is in contact with three sidewalls of each of the first body contact and the second body contact.

7. The high voltage semiconductor device of claim 6, wherein the separation distance between the first gate electrode and the second gate electrode is less than or equal to a sum of first direction widths of a part of the source and the body contact that are in contact with each other along the first direction.

8. The high voltage semiconductor device of claim 6, further comprising:
   a gate field plate between each of the gate electrodes and the drain.

9. The high voltage semiconductor device of claim 6, further comprising:
   a silicide film on the source, the body contact, each of the gate electrodes and the drain.

10. The high voltage semiconductor device of claim 6, wherein the first and second body contacts are physically separated from each other.

11. A method of manufacturing a high voltage semiconductor device, the method comprising:
   forming a drift region in a substrate;
   forming a body region in the substrate;
   forming a first gate electrode and a second gate electrode on the substrate, the first and second gate electrodes extending along a second direction and spaced apart from each other along a first direction perpendicular to the second direction, the first and second directions defining a horizontal plane;
   forming a drain in the drift region and a source in the body region, the source extending continuously along the second direction; and
   forming a body contact in the body region in contact with the source,
   wherein the body contact comprises:
      a first body contact adjacent to the first gate electrode; and
      a second body contact adjacent to the second gate electrode,
   each of the first body contact and the second body contact is configured as an island type structure, is spaced apart from each other along the second direction, and has a width along the first direction smaller than a separation distance between the first gate electrode and the second gate electrode, and the first body contact and the second body contact have center points spaced apart or offset from each other in both the first direction and the second direction.

12. The method of claim 11, wherein the first body contact and the second body contact have substantially a same area or size.

13. The method of claim 11, wherein a separation distance between centers of the first body contact and the second body contact in the first direction substantially coincides with a width of the first body contact or the second body contact in the first direction.

14. The method of claim 11, further comprising:
forming a plurality of gate field plates before forming the first gate electrode and the second gate electrode, wherein each of the first gate electrode and the second gate electrode overlap a corresponding one of the gate field plates.

15. The method of claim 11, further comprising:
forming a lower insulating film covering the first gate electrode, the second gate electrode, and the substrate;
forming a source contact, a drain contact, and a gate contact in the lower insulating film; and
forming a source metal, a drain metal, and a gate metal on the lower insulating film in contact with the source contact, the drain contact, and the gate contact, respectively.

16. The method of claim 11, wherein the separation distance between the first gate electrode and the second gate electrode is less than twice a width of the first body contact or the second body contact in the first direction.

17. The method of claim 11, wherein the first body contact overlaps with the first gate electrode, and the one or more second body contact overlaps with the second gate electrode.

18. The high voltage semiconductor device of claim 11, wherein the source is in contact with at most the three sidewalls of each of the first body contact and the second body contact.

19. The method of claim 11, wherein the source is in contact with three sidewalls of each of the first body contact and the second body contact.

20. The method of claim 19, wherein the source is in contact with at most the three sidewalls of each of the first body contact and the second body contact.

* * * * *